(12) United States Patent
Lee et al.

(10) Patent No.: US 8,105,663 B2
(45) Date of Patent: Jan. 31, 2012

(54) COMPOSITION FOR FORMING SUBSTRATE, AND PREPREG AND SUBSTRATE USING THE SAME

(75) Inventors: Keun Yong Lee, Gyunggi-do (KR); Jun Rok Oh, Seoul (KR); Seong Hyun Yoo, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 92 days.

(21) Appl. No.: 12/507,647

(22) Filed: Jul. 22, 2009

(65) Prior Publication Data

US 2010/0283004 A1 Nov. 11, 2010

(30) Foreign Application Priority Data

May 6, 2009 (KR) .......................... 10-2009-0039352

(51) Int. Cl.
| | |
|---|---|
| *C09K 19/38* | (2006.01) |
| *C09K 19/58* | (2006.01) |
| *C09K 19/34* | (2006.01) |
| *C09K 19/32* | (2006.01) |
| *C09K 19/20* | (2006.01) |
| *H01K 1/03* | (2006.01) |

(52) U.S. Cl. ...... 428/1.6; 428/901; 174/255; 252/299.1; 252/299.5; 252/299.61; 252/299.62; 252/299.67

(58) Field of Classification Search .................. 174/250, 174/254, 255; 428/901; 252/299.01, 299.67, 252/299.5, 299.61, 299.62; 361/748

See application file for complete search history.

(56) References Cited

U.S. PATENT DOCUMENTS

| | | | | |
|---|---|---|---|---|
| 7,507,784 | B2 * | 3/2009 | Dingemans et al. | 528/170 |
| 7,655,155 | B2 * | 2/2010 | Jung et al. | 252/299.01 |
| 2002/0132933 | A1 * | 9/2002 | Dingemans et al. | 525/437 |
| 2009/0117348 | A1 * | 5/2009 | Cho et al. | 428/195.1 |
| 2009/0151987 | A1 * | 6/2009 | Yang et al. | 174/250 |
| 2009/0308643 | A1 * | 12/2009 | Cho et al. | 174/256 |
| 2010/0124037 | A1 * | 5/2010 | Jung et al. | 361/783 |
| 2010/0139961 | A1 * | 6/2010 | Kim et al. | 174/258 |

* cited by examiner

*Primary Examiner* — Shean Wu

(74) *Attorney, Agent, or Firm* — Blakely Sokoloff Taylor & Zafman LLP

(57) ABSTRACT

Disclosed herein is a composition for forming a substrate, comprising: a liquid crystal thermosetting oligomer having one or more soluble structural units in the main chain thereof and having thermosetting groups at one or more ends of the main chain thereof; and a metal alkoxide compound having reaction groups which can be covalently bonded with the thermosetting groups.

21 Claims, 2 Drawing Sheets

COMPOSITION FOR FORMING SUBSTRATE, AND PREPREG AND SUBSTRATE USING THE SAME

CROSS REFERENCE TO RELATED APPLICATION

This application claims the benefit of Korean Patent Application No. 10-2009-0039352, filed May 6, 2009, entitled "Composition for forming substrate, and prepreg and substrate using the same", which is hereby incorporated by reference in its entirety into this application.

BACKGROUND OF THE INVENTION

1. Technical Field

The present invention relates to a composition for forming a substrate, and a prepreg and substrate using the same. More particularly, the present invention relates to a composition for forming a substrate, comprising a liquid crystal thermosetting oligomer having one or more soluble structural units in the main chain thereof and having thermosetting groups at one or more ends of its main chain, and a metal alkoxide compound having reaction groups which can be covalently bonded with the thermosetting groups, and to a prepreg and substrate using the same.

2. Description of the Related Art

With the advancement of electronic appliances, printed circuit boards (PCB) are becoming lighter, thinner and smaller day by day. In order to meet these requirements, wiring of a printed circuit board is also becoming more complicated and highly densified. For this reason, electrical stability, thermal stability and mechanical stability are important factors affecting a printed circuit board. In particular, among them, thermal stability, for example, the coefficient of thermal expansion (CTE) is one of the important factors influencing reliability at the time of manufacturing a printed circuit board.

A printed circuit board chiefly comprises copper serving as circuit wiring and a polymer serving as an interlayer insulator. The CTE of the polymer constituting an insulation layer is much higher than those of copper. In order to overcome the difference in CTE between the polymer and copper, the CTE of the polymer constituting an insulation layer is being decreased by impregnating the polymer into a non-woven glass fiber fabric or adding an inorganic filler to the polymer.

Generally, with the increase in the amount of the inorganic filler added to the polymer, the CTE of the polymer decreases, but there is a limit to using this technique in the process of manufacturing a printed circuit board. Further, in order to meet the requirement for highly-densified fine patterns, surface roughness is also considered as an important factor. The size of an inorganic filler added in order to control the surface roughness of the printed circuit board is becoming smaller. However, as the size of the inorganic filler decreases, the problem with the uniform dispersibility of the inorganic filler is on the rise, and, particularly, the problem that the nanoscale filler must be uniformly dispersed is also on the rise.

Ultimately, a polymer material having a coefficient of thermal expansion equal to that of copper is required. However, conventional polymer materials, which are obtained by adjusting the kind and content of a polymer and the size and content of an inorganic filler, cannot sufficiently satisfy such a requirement.

Generally, an insulation layer of a printed circuit board is chiefly made of epoxy. Epoxy itself has a CTE of about 70~100 ppm/°C. In order to decrease the CTE thereof, epoxy is impregnated into a non-woven glass fiber fabric, or an inorganic filling having a low CTE is added to an epoxy matrix, thereby realizing epoxy having a low CTE (refer to FIG. 1). The CTE of epoxy is linearly decreased in proportion to the amount of added inorganic filer. However, when a large amount of inorganic filler is added, the CTE of epoxy decreases, but the viscosity of epoxy rapidly increases, so that it is difficult to form a product.

In particular, in the case of an insulation film having a multilayer structure which is used for a printed circuit board, it is impossible to perform interlayer coupling.

For these limitations, the CTE of epoxy itself is decreased, and simultaneously a critical amount of an inorganic filler is added thereto. In order to decrease the CTE of epoxy itself, epoxy resins having different structures from each other are mixed and then used. In this case, the component and composition of each of the epoxy resins play an important role in the decrease in the CTE thereof. Further, the CTE of epoxy is greatly influenced by the kind, size and shape of the added inorganic filler as well as the amount thereof. Although the size of the added inorganic filler must be decreased to a very large extent, that is, must be on the nanoscale in size in order to realize ultrafine patterns, it is difficult to obtain a film uniformly dispersed therein with the inorganic filler.

As such, it is limited to realizing thin and highly-densified integrated circuit patterns, and it is difficult to satisfy the required thermal, electrical and mechanical properties.

SUMMARY OF THE INVENTION

Hence, the present inventors conducted research to solve the above-mentioned problems. As a result, they obtained an organic-inorganic nanocomposite material, as an insulation material for a substrate having excellent thermal stability (CTE), electrical stability and mechanical stability, using a liquid crystal thermosetting (LCT) oligomer having thermosetting groups and a metal alkoxide compound having reaction groups which can be covalently bonded with the thermosetting groups. Based on this organic-inorganic nanocomposite material, the present invention was completed.

Accordingly, the present invention provides a composition for forming a substrate having excellent thermal, electrical and mechanical properties, and a prepreg and substrate using the same.

Further, the present invention provides a composition for forming a substrate, which can be formed into a film uniform in quality, and a prepreg and substrate using the same.

An aspect of the present invention provides a composition for forming a substrate, comprising: a liquid crystal thermosetting oligomer having one or more soluble structural units in the main chain thereof and having thermosetting groups at one or more ends of its main chain; and a metal alkoxide compound having reaction groups which can be covalently bonded with the thermosetting groups.

In the liquid crystal thermosetting oligomer, the soluble structural unit may include an aryl-amine group of C4~C30 or an aryl-amide group of C4~C30.

The soluble structural unit may include a compound represented by Formula 1 below:

                                    [Formula 1]

wherein Ar is an aryl group of C4~C30; and $X^1$ and $Y^1$ are each independently selected from the group consisting of COO, O, CONR'', NR''' and CO, in which R'' and R''' are each independently selected from the group consisting of a hydrogen atom, an alkyl group of C1~C20 and an aryl group of C6~C30, and at least one of $X^1$ and $Y^1$ is CONR'' or NR'''.

The soluble structural unit may include one or more structural units selected from among compounds represented by Formula 2 below:

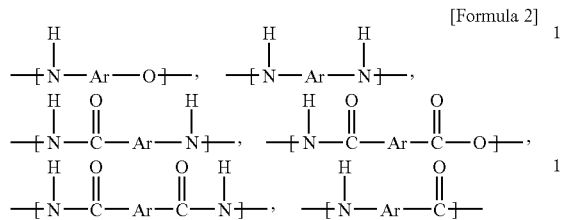

[Formula 2]

wherein Ar is an aryl group of C4~C30.

Here, the Ar may be an aryl group or a substitution product thereof selected from among compounds represented by Formula 3 below:

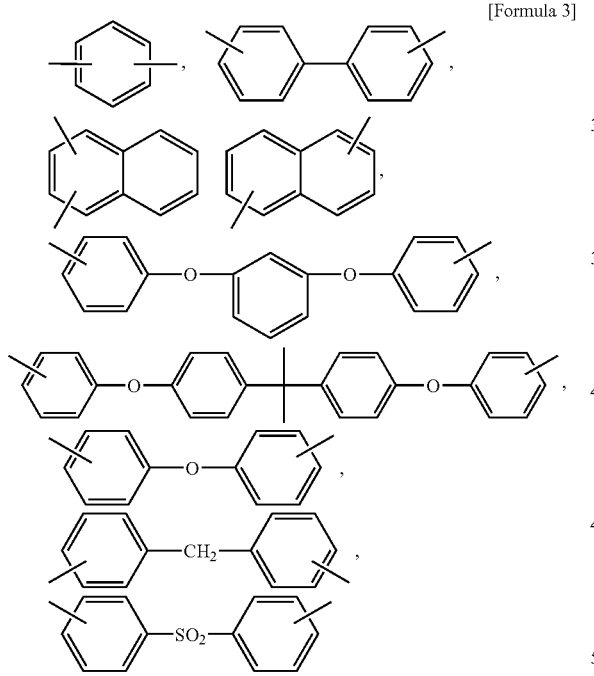

[Formula 3]

Meanwhile, the soluble structural unit may be included in an amount of more than 5 mol % to 60 mol % or less based on a total amount of all the structural units.

Further, the liquid crystal thermosetting oligomer may further include a structural unit represented by Formula 4 in its main chain:

$$X^2—Ar—Y^2 \qquad \text{[Formula 4]}$$

wherein Ar is an aryl group of C4~C30; and $X^2$ and $Y^2$ are each independently selected from the group consisting of COO, O, CONR'', NR''' and CO, in which R'' and R''' are each independently selected from the group consisting of a hydrogen atom, an alkyl group of C1~C20 and an aryl group of C6~C30.

The structural unit represented by Formula 4 above may include one or more structural units selected from among compounds represented by Formula 5 below:

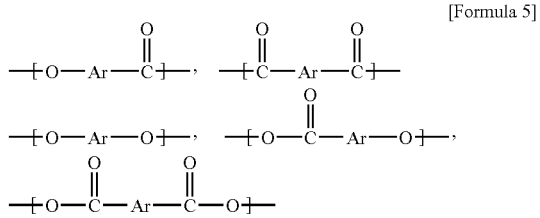

[Formula 5]

wherein Ar is an aryl group of C4~C30.

Here, the Ar may be selected from among compounds represented by Formula 3 below:

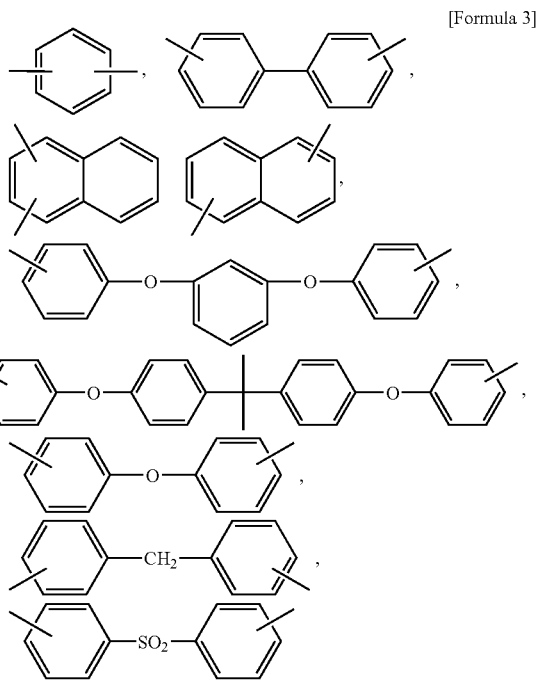

[Formula 3]

The thermosetting group may be a thermal crosslinking reaction group.

According to an embodiment of the present invention, the thermosetting group may be selected from the group consisting of maleimide, nadimide, phthalimide, acetylene, propagyl ether, benzocyclobutene, cyanate, and substitution products or derivatives thereof.

According to an embodiment of the present invention, the liquid crystal thermosetting oligomer may be a compound represented by Formula 6 below:

$$Z^1—(R^1)_m—(R^2)_n—Z^2 \qquad \text{[Formula 6]}$$

wherein $R^1$ is one or more structural units selected from among compounds represented by Formula 2 below; $R^2$ is one or more structural units selected from among compounds represented by Formula 5 below; $Z^1$ and $Z^2$ are identical to or different from each other, and are each independently selected from the group consisting of hydrogen, halogen, a hydroxy group, maleimide, nadimide, phthalimide, acetylene, propagyl ether, benzocyclobutene, cyanate, and substitution products or derivatives thereof; at least one of $Z^1$ and $Z^2$ is selected from the group consisting of maleimide, nadimide, phthalimide, acetylene, propagyl ether, benzocyclobutene, cyanate, and substitution products or derivatives thereof; n and m are each independently an integer of 1~50; and n/(n+m+2) is more than 5% to 60% or less:

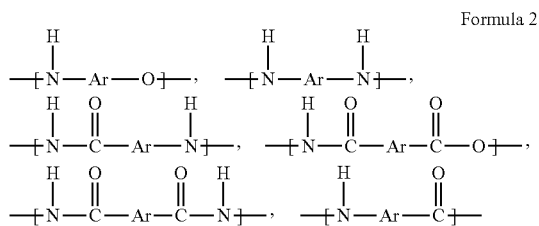

Formula 2 wherein Ar is an aryl group of C4~C30;

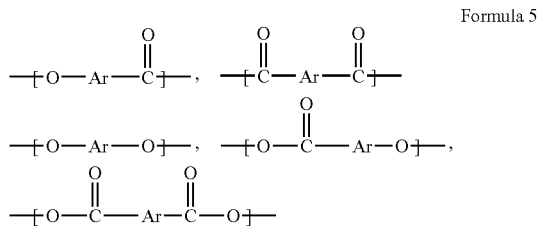

Formula 5 wherein Ar is an aryl group of C4~C30.

According to an embodiment of the present invention, the liquid crystal thermosetting oligomer may be a compound represented by Formula 7 or Formula 8 below:

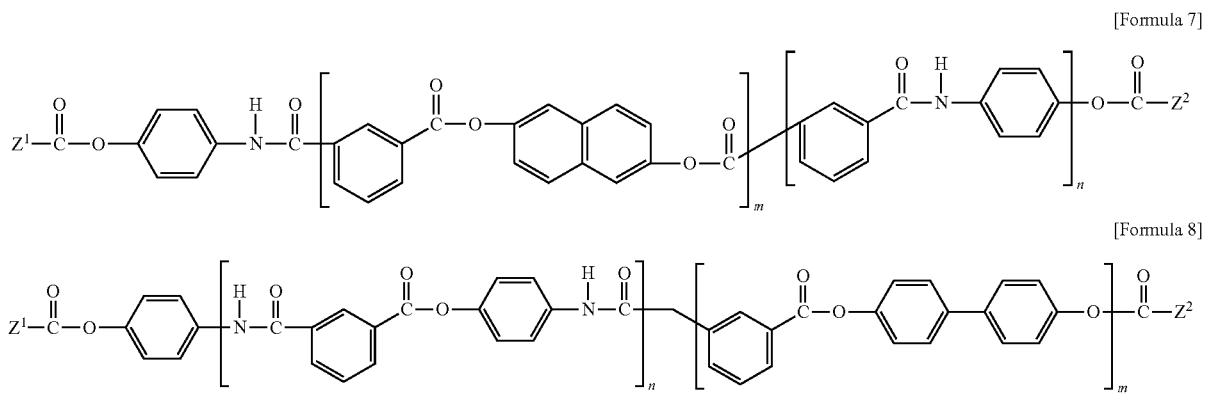

wherein $Z^1$ and $Z^2$ are identical to or different from each other, and are each independently selected from the group consisting of maleimide, nadimide, phthalimide, acetylene, propagyl ether, benzocyclobutene, cyanate, and substitution products or derivatives thereof; and n and m are each independently an integer of 1~50.

The liquid crystal thermosetting oligomer may have a number average molecular weight of 500~15,000.

Meanwhile, the reaction group, which can be covalently bonded with the thermosetting group, may be selected from the group consisting of a vinyl group, an acryl group, a methacryl group, a mercapto group, and combinations thereof.

The metal alkoxide compound may include a metal selected from the group consisting of Ti, Al, Ge, Co, Ca, Hf, Fe, Ni, Nb, Mo, La, Re, Sc, Si, Ta, W, Y, Zr and V.

The composition may include 5~200 parts by weight of the metal alkoxide compound based on 100 parts by weight of the liquid crystal thermosetting oligomer.

The composition may further comprise an inorganic filler.

Another aspect of the present invention provides a prepreg prepared using the composition.

Still another aspect of the present invention provides a substrate manufactured using the composition.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
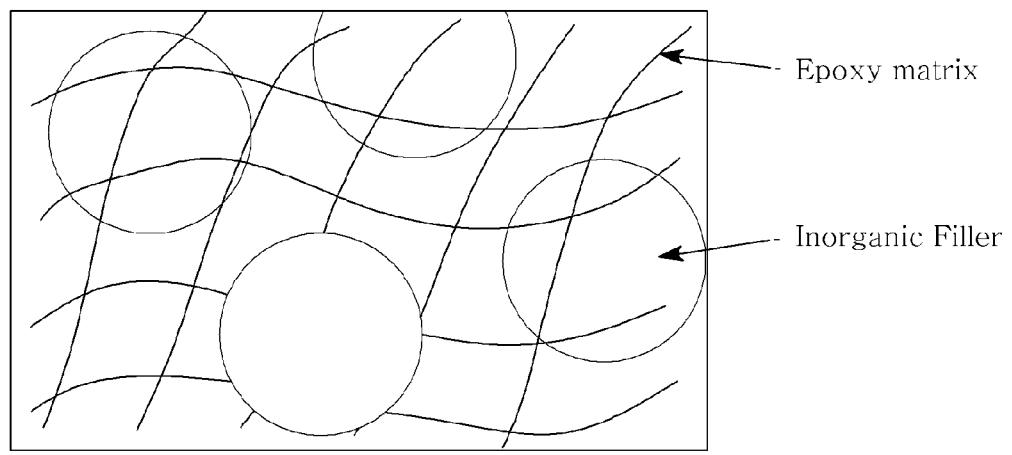
FIG. 1 is a conceptual view showing a state in which an inorganic filler is present in an epoxy matrix after having been added thereto according to a conventional technology.

Hereinafter, preferred embodiments of the present invention will be described in detail with reference to the attached drawings.

As described above, according to the present invention, an inorganic nanoscale three-dimensional reticulated cluster is uniformly formed in a polymer matrix in-situ, and simultaneously, at the time of a curing reaction, a predetermined reaction group (for example, a vinyl group, an acrylic group, a methacrylic group or a mercapto group) reacts with a main chain in a LCT matrix, thereby obtaining a substrate material having thermal, mechanical and electrical properties.

Specifically, in the present invention, a soluble liquid crystal thermosetting (LCT) oligomer is used instead of a commonly-used epoxy resin. The LCT oligomer has both a structure exhibiting liquid crystalline properties and a soluble structure which is soluble in some solvents. Further, the LCT oligomer has thermosetting groups at one or more ends thereof.

That is, the liquid crystal thermosetting oligomer includes one or more soluble structural units in the main chain thereof and has thermosetting groups at one or more ends of its main chain. In the present patent application, the "soluble oligomer" means an oligomer having excellent solubility in a solvent.

Generally, since a polymer resin has very high viscosity even when it is melted or dissolved in a solvent, it is difficult to increase its solid content. In particular, when it is impregnated into a non-woven glass fiber fabric, it cannot be easily impregnated thereinto because its viscosity is high, and, when its solid content is low, it is not sufficiently impregnated thereinto, so that reprocessing steps are required, thereby increasing processing costs. In contrast to such a polymer resin, since the liquid crystal thermosetting oligomer of the present invention has low viscosity and a high dielectric constant, thermal expansion coefficient, water resistance and solubility, manufacturing costs can be reduced when it is used as a substrate material.

The soluble structural unit inserted in the main chain of the liquid crystal thermosetting oligomer may be an aryl-amine group of C4~C30 or an aryl-amide group of C4~C30. The soluble structural unit may include a compound represented by Formula 1 below:

$$X^1-Ar-Y^1 \qquad \text{Formula 1}$$

wherein Ar is an aryl group of C4~C30; and $X^1$ and $Y^1$ are each independently selected from the group consisting of COO, O, CONR'', NR''' and CO, in which R'' and R''' are each independently selected from the group consisting of a hydrogen atom, an alkyl group of C1~C20 and an aryl group of C6~C30, and at least one of $X^1$ and $Y^1$ is CONR'' or NR'''.

The soluble structural unit includes, but is not limited to, one or more structural units selected from among compounds represented by Formula 2 below:

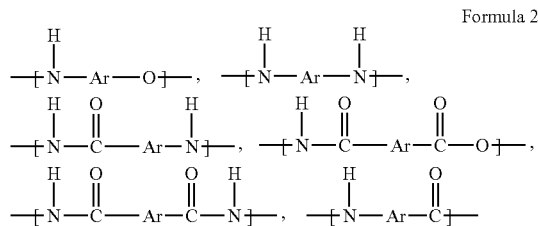

Formula 2 wherein Ar is an aryl group of C4~C30.

In the respective structural units constituting the liquid crystal oligomer, Ars are different from or equal to each other, and the aromatic ring of Ar may be substituted with an amide group, an ester group, a carboxyl group, an alkoxy group, an aryl group or a fluoromethyl group.

Examples of Ar may include, but are not limited to, compounds represented by Formula 3 below:

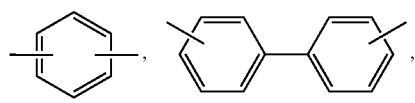

Formula 3

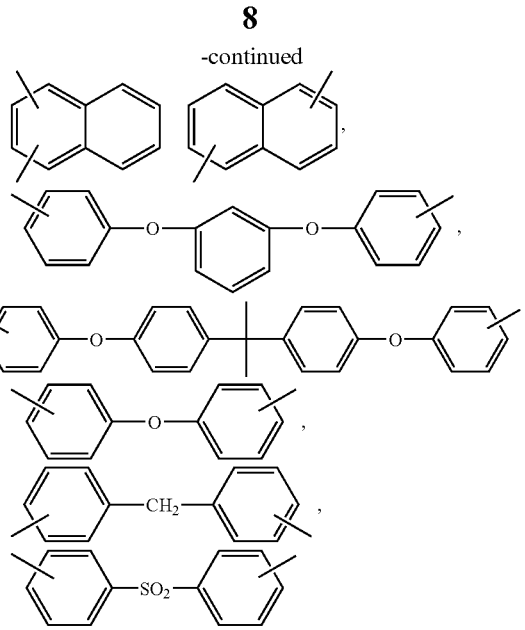

The soluble structural unit may be included in an amount of more than 5 mol % to 60 mol % or less based on a total of all the structural units. When the amount of the soluble structural unit is 5 mol % or less, there is a problem in that the solubility of the liquid crystal thermosetting oligomer in a solvent is slightly improved. In contrast, when the amount of the soluble structural unit is more than 60 mol %, there is a problem in that the hydrophilicity of the liquid crystal thermosetting oligomer increases, and thus the water resistance thereof decreases. The amount of the soluble structural unit in the liquid crystal thermosetting oligomer is controlled by adjusting the amount of a monomer added at the time of a reaction, and thus the liquid crystal thermosetting oligomer can have a soluble structure of the desired form. The amount of the soluble structural unit can be controlled by changing the size, mass, properties and chemical composition thereof.

The liquid crystal thermosetting oligomer may further include a structural unit represented by Formula 4 below in its main chain:

$$X^2-Ar-Y^2 \qquad \text{Formula 4}$$

wherein Ar is an aryl group of C4~C30; and $X^2$ and $Y^2$ are each independently selected from the group consisting of COO, O, CONR'', NR''' and CO, in which R'' and R''' are each independently selected from the group consisting of a hydrogen atom, an alkyl group of C1~C20 and an aryl group of C6~C30.

Examples of the structural unit represented by Formula 4 above may include one or more structural units selected from among compounds represented by Formula 5 below:

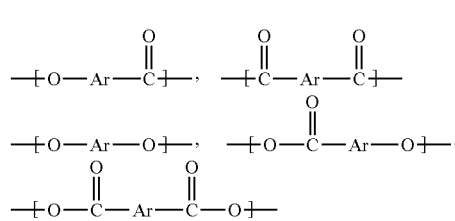

Formula 5 wherein Ar is an aryl group of C4~C30.

When two or more structural units are selected from among compounds represented by Formula 5 above, the Ar units of the respective structure units are different from or equal to each other, and the aromatic ring of the Ar unit may be substituted with an amide group, an ester group, a carboxyl group, an alkoxy group, an aryl group or a fluoromethyl group. Specifically, the Ar may be selected from among compounds represented by Formula 3 below:

Formula 3

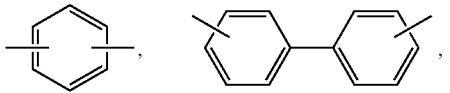

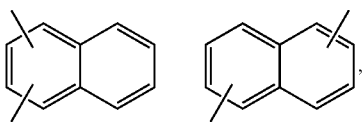

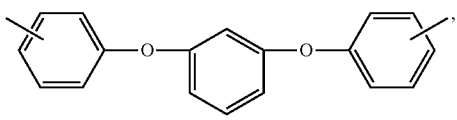

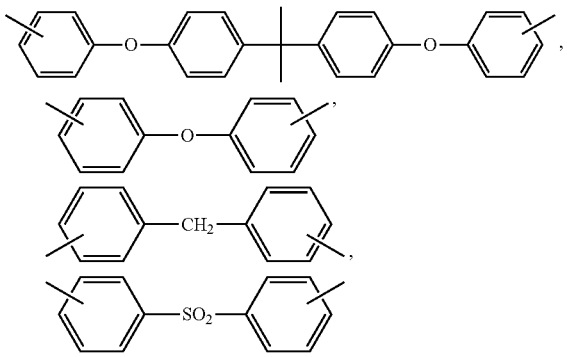

The liquid crystal thermosetting oligomer may have thermosetting groups, which are equal to or different from each other, at one or more ends of its main chain. When the composition for forming a substrate of the present invention is used to manufacture a printed circuit board, the thermosetting groups are crosslinked with each other to form a stable reticulated structure, thus improving the mechanical properties of the printed circuit board.

The thermosetting group may be a thermal crosslinking reaction group. Examples of the thermosetting group may include, but are not limited to, compounds selected from the group consisting of maleimide, nadimide, phthalimide, acetylene, propagyl ether, benzocyclobutene, cyanate, and substitution products or derivatives thereof. In the present patent application, the "substitution product" means a structure in which the ends of the thermal crosslinking reaction group are partially substituted with a substituent group such as an alkyl group, a halogen atom, an aryl group or the like. For example, in the case of a maleimide reaction group, the substitution product may include a compound in which one or more hydrogen atoms present in a double bond are substituted with an alkyl group such as a methyl group or the like. Further, in the present patent application, the "derivative" means a structure in which the thermal crosslinking reaction group is bonded with an aromatic group, a heteroaromatic group or the like. For example, in the case of a maleimide reaction group, the derivative may include a compound in which the maleimide reaction group is bonded with a benzene ring or naphthalene.

Preferably, the liquid crystal thermosetting oligomer may be a compound represented by Formula 6 below:

$$Z^1-(R^1)_m-(R^2)_n-Z^2 \qquad \text{Formula 6}$$

wherein $R^1$ is one or more structural units selected from among compounds represented by Formula 2 below; $R^2$ is one or more structural units selected from among compounds represented by Formula 5 below; $Z^1$ and $Z^2$ are identical to or different from each other, and are each independently selected from the group consisting of hydrogen, halogen, a hydroxy group, maleimide, nadimide, phthalimide, acetylene, propagyl ether, benzocyclobutene, cyanate, and substitution products or derivatives thereof; and n and m are each independently a positive integer, and preferably, an integer of 1~50:

Formula 2

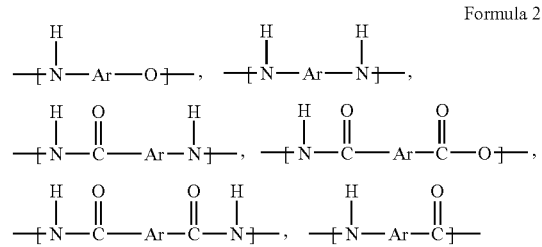

wherein Ar is an aryl group of C4~C30;

Formula 5

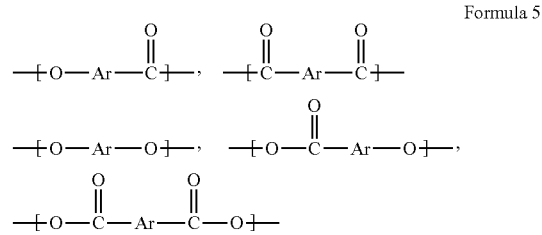

wherein Ar is an aryl group of C4~C30.

Further, in Formula 6 above, $R^1$ and $R^2$ may be repeated in the form of a block or may be repeated at random. For example, $R^1$ and $R^2$ may be repeated in the form of $Z^1R^1R^1R^1 \ldots R^2R^2R^2Z^2$, $Z^1R^1R^1R^2 \ldots R^2R^2Z^2$, $Z^1R^1R^2R^2R^2 \ldots R^1R^2Z^2$ or $Z^1R^1R^2R^1R^2 \ldots R^2R^2Z^2$.

The liquid crystal thermosetting oligomer may be a compound represented by Formula 7 or Formula 8 below:

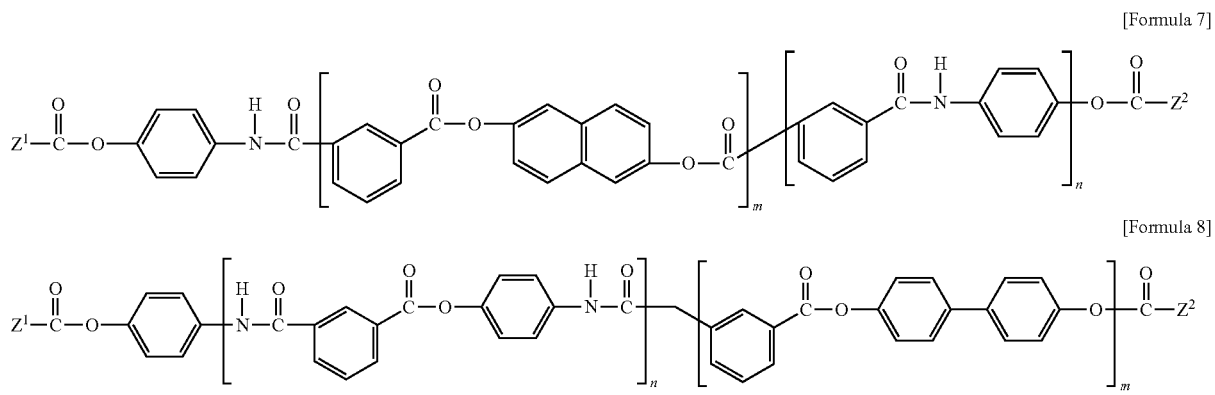

[Formula 7]

[Formula 8]

wherein $Z^1$ and $Z^2$ are identical to or different from each other, and are each independently selected from the group consisting of maleimide, nadimide, phthalimide, acetylene, propagyl ether, benzocyclobutene, cyanate, and substitution products or derivatives thereof; and n and m are each independently a positive integer, and preferably, an integer of 1~50.

In the compounds represented by Formula 6 to 8 above, n/(n+m+2) may be in a range of more than 5% to 60% or less.

The molecular weight of the liquid crystal thermosetting oligomer may be 500~15000. When the molecular weight of the liquid crystal thermosetting oligomer is less than 500, the liquid crystal thermosetting oligomer becomes brittle because its crosslink density becomes high. When the molecular weight thereof is more than 15000, it is difficult to impregnate it into a non-woven glass fiber fabric because its viscosity becomes high.

A method of preparing the liquid crystal thermosetting oligomer is not particularly limited. The liquid crystal thermosetting oligomer may be prepared by reacting a compound which can prepare a liquid crystal oligomer including soluble structural units with a compound which can provide thermosetting groups through a polymerization process.

The compound which can prepare a liquid crystal oligomer including soluble structural units is not particularly limited. For example, the compound may be selected from the group consisting of an aromatic, heteroaromatic or aliphatic dicarboxylic acid; an aromatic, heteroaromatic or aliphatic diol; an aromatic, heteroaromatic or aliphatic diamine; an aminophenol; hydroxybenzoic acid; and an aminobenzoic acid. Preferably, the compound may include one or more selected from among an aromatic, heteroaromatic or aliphatic diol; aminophenol; and aminobenzoic acid.

For example, the liquid crystal thermosetting oligomer may be prepared through solution polymerization or bulk polymerization. The solution polymerization or bulk polymerization may be performed in a reactor provided with a suitable stirrer.

A method of preparing the liquid crystal thermosetting oligomer through the solution polymerization is described as follows. First, isophthaloyl chloride, aminophenol, 2,6-dihydroxynaphthalene and triethylamine are put into a reactor, and are then reacted while being stirred at room temperature to obtain an intermediate. Subsequently, a compound which can provide thermosetting groups (for example, maleimide-benzoyl chloride, which is a compound that can provide maleimide, nadimide or acetylene) is additionally added to the intermediate and then reacted therewith to obtain a liquid crystal thermosetting oligomer. Finally, the obtained liquid crystal thermosetting oligomer is separated and refined.

Meanwhile, a method of preparing the liquid crystal thermosetting oligomer through bulk polymerization is described as follows. Isophthalic acid, aminophenol, 2-hydroxy-6-naphthoic acid and acetic anhydride are put into a reactor, are heated to a temperature of 150° C. while being stirred, and are then reacted for a predetermined time while being refluxed to obtain an intermediate. Subsequently, acetic acid and acetic anhydride, which are side products, are removed, and then 4-hydroxybenzoic acid is additionally added to the intermediate, and then the intermediate mixed with the 4-hydroxybenzoic acid is heated to a temperature of 320° C. and then reacted for a predetermined time to synthesize a liquid crystal oligomer having an alcohol group at one or more ends of the main chain thereof. Then, the liquid crystal oligomer is dissolved in a solvent (for example, dimethylformamide (DMF)), and then a compound which can provide thermosetting groups is added thereto, and then the liquid crystal oligomer is reacted with the compound, thereby obtaining a liquid crystal thermosetting oligomer provided at one or more ends of the main chain thereof with thermosetting groups.

Another method of preparing the liquid crystal thermosetting oligomer through bulk polymerization is described as follows. Isophthalic acid, aminophenol, 2-hydroxy-6-naphthoic acid and acetic anhydride are put into a reactor, are heated to a temperature of 150° C. while being stirred, and are then reacted for a predetermined time while being refluxed to obtain an intermediate. Subsequently, acetic acid and acetic anhydride, which are side products, are removed from the intermediate while slowly heating the intermediate to a temperature of 230° C. and then reacted for a predetermined time to synthesize a liquid crystal oligomer. Then, nadimide benzoic acid is additionally added to the liquid crystal oligomer, and is then heated to a temperature of 250° C., thereby obtaining the liquid crystal thermosetting oligomer.

In the present invention, instead of decreasing the CTE of a polymer by using the LCT oligomer as a main matrix and adding a filler thereto, an inorganic nanoscale cluster is uniformly formed in the LCT oligomer matrix in-situ using an organic metal compound, thus causing the cluster to have a reaction group, such as a vinyl group, an acrylic group, a methacrylic group or a mercapto group, which can be thermally cured with a thermosetting group present at an end of the LCT oligomer. When the curing reaction of the LCT oligomer, which is a main matrix, is conducted, the reaction group strongly covalent-bonded with the formed cluster directly participates in the reaction between the LCT oligomer and the cluster, thus causing the LCT oligomer to be strongly covalent-bonded with the cluster. Therefore, the mobility of a polymer chain, which is a main cause of thermal expansion, can be greatly decreased by forming a strong covalent bond between the LCT oligomer and the cluster.

Examples of the organic metal compound, that is, a metal alkoxide compound, which has a reaction group which can form a covalent bond with the LCT oligomer, may include, but are not limited to, compounds represented by Formulae 9 to 12 below.

[Formula 9]

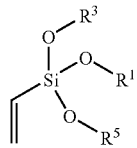

wherein $R^3$ to $R^5$ may be each independent alkyl groups generally used as substituent groups, but is not limited thereto.

[Formula 10]

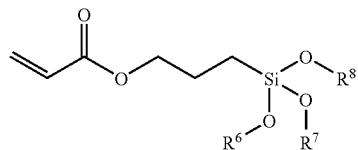

wherein $R^6$ to $R^8$ may be each independent alkyl groups generally used as substituent groups, but is not limited thereto.

[Formula 11]

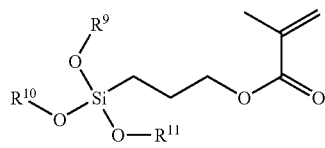

wherein $R^9$ to $R^{11}$ may be each independent alkyl groups generally used as substituent groups, but is not limited thereto.

[Formula 12]

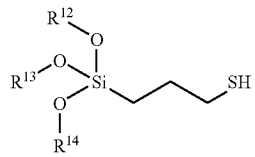

wherein $R^{12}$ to $R^{14}$ may be each independent alkyl groups generally used as substituent groups, but is not limited thereto.

Meanwhile, the metal alkoxide compound includes various metals such as Ti, Al, Ge, Co, Ca, Hf, Fe, Ni, Nb, Mo, La, Re, Sc, Ta, W, Y, Zr, V and the like, in addition to the above Si. Further, examples of the reaction group, which can be covalently bonded with the thermosetting group, may include, but are not limited to, a vinyl group (Formula 9), an acryl group (Formula 10), a methacryl group (Formula 11), a mercapto group (Formula 12), and the like.

Meanwhile, the composition including the LCT oligomer and metal alkoxide compound is formed into an inorganic three-dimensional reticulate $MO_xR''''_{1-x}$ (M is a metal, and R'''' is a general substituent group) of 20~100nm through a sol-gel process, and then the reaction group connected to the inorganic three-dimensional reticulate $MO_xR''''_{1-x}$ by a covalent bond forms a covalent bond with the main chain of the LCT oligomer, which is a main matrix. In this case, as a material for forming the inorganic cluster, each metal compound having one reaction group may be independently used, or a combination of metal compounds having various reaction groups may be used.

Further, in order to maximize the decrease in CTE, the composition for forming a substrate may further include a small amount of an inorganic filler (about 5~20 wt %).

The amount of the metal alkoxide compound may be 5~200 parts by weight, preferably 10~100 parts by weight, and more preferably be 40~80 parts by weight, based on 100 parts by weight of the LCT oligomer. Meanwhile, in the hydrolytic condensation of the metal alkoxide compound, an acid catalyst selected from among hydrochloric acid, sulfuric acid, nitric acid, formic acid and the like, or a base catalyst selected from among ammonia, amine, sodium hydroxide and the like may be used. The amount of the catalyst may be 0.001~1 mol, preferably 0.01~0.2 mol per 1 mol of the metal alkoxide compound. The reaction time necessary for the hydrolytic condensation of the metal alkoxide compound may be 0.1~20 hours, preferably 0.5~5 hours although it is variable depending on the kind or amount of the catalyst. However, the present invention is not limited thereto.

Further, since the composition for forming a substrate according to an embodiment of the present invention can be applied to a solvent casting process, it enables glass fiber to be impregnated therewith. A polar nonprotonic solvent may be used as a solvent for the composition for forming a substrate. For example, the polar nonprotonic solvent may be selected from the group consisting of N,N-dimethylacetamide, N-methylpyrrolidone (NMP), N-methylcaprolactone, N,N-dimethylformamide, N,N-diethylformamide, N,N-diethylacetamide, N-methylpropionamide, dimethylsulfoxide, γ-butyllactone, dimethylimidazolidinone, tetramethylphosphoric amide, ethylcellosolve, and mixtures thereof. The composition for forming a substrate may include 0.1~300 parts by weight of a liquid crystal thermosetting oligomer based on 100 parts by weight of a solvent.

The composition for forming a substrate according to an embodiment of the present invention may further include a toughening agent. When the toughening agent is mixed with the liquid crystal thermosetting oligomer, the flexibility of the composition can be improved. The toughening agent, which is an aromatic polymer, may have a number average molecular weight of 2,000~500,000. Examples of the aromatic polymer may include, but are not limited to, aromatic polymers including one or more mesogen groups selected from the group consisting of ester, ester-amide, ester-imide, ester-ether and ester-carbonate at the main chains thereof. The mixing ratio of the liquid crystal thermosetting oligomer and the toughening agent may be 99.5:0.5~35:65 by weight.

If necessary, the composition for forming a substrate according to an embodiment of the present invention may further include one or more additives selected from among a filler, a softening agent, a plasticizer, a lubricant, an antistatic agent, a colorant, an antioxidant, a heat stabilizer, a light stabilizer and a UV absorber. Examples of the filler may include organic fillers, such as epoxy resin powder, melamine resin powder, urea resin powder, benzoguanamine resin powder, styrene resin powder and the like, and inorganic fillers, such as silica, alumina, titania, zirconia, kaolin, calcium carbonate, calcium phosphate and the like.

The composition for forming a substrate can be used for a packaging material because it has high adhesion strength to copper foil and has high heat resistance, low expandability and excellent mechanical properties. The composition may be formed into a substrate or varnish for impregnation or coating. The composition can be applied to printed circuit boards, multilayer substrates, resin coated copper (RCCs), copper clad laminates (CCLs), films for tape automated bonding (TAB), and the like, but the use of the composition is not limited thereto.

In order to use the composition for a substrate, it may be cast on the substrate and then cured.

An organic-inorganic nanocomposite material prepared using the LCT oligomer can be formed into a prepreg by impregnating it into a non-woven glass fiber fabric, or can be used as an insulation material for printed circuit boards and the like by forming it into a buildup film itself.

The prepreg is formed by impregnating the composition into a reinforcing material. Specifically, the prepreg is fabricated in the form of a sheet by impregnating the composition for a substrate into the reinforcing material and then curing the composition. Examples of the reinforcing material may include, but are not limited to, a woven glass fiber fabric, a woven alumina glass fiber fabric, a non-woven glass fiber fabric, a non-woven cellulose fabric, a woven carbon fiber fabric, a woven polymer fabric, and the like. Methods of impregnating the composition into the reinforcing material may include dip coating, roll coating, and other impregnation methods.

Further, the composition can be formed into a substrate. Examples of the substrate may include, but are not particularly limited to, multilayered substrates, metal foil coated laminates, printed circuit boards, and the like. Moreover, the composition may be fabricated in the form of a laminate in which the prepreg is coated with metal foil.

The substrate may have various shapes, and, particularly, may be fabricated in the form of a film. The film can be formed by thin-film-coating the substrate with the composition.

The substrate may be a laminate coated with metal foil. As the metal foil, copper foil, aluminum foil or the like may be used. The thickness of the metal foil is changed depending on the use thereof, but may be 5~100 μm. The laminate coated with metal foil can be fabricated into a printed circuit board by performing a circuit formation process. Moreover, a multilayered printed circuit board can also be fabricated by layering the laminate coated with metal foil on the surface of the printed circuit board.

Examples of the laminate coated with metal foil may include, but are not limited to, a resin coated copper (RCC), a copper clad laminate (CCL), and the like.

Hereinafter, the present invention will be described in more detail with reference to the following Examples. However, the scope of the present invention is not limited thereto.

PREPARATION EXAMPLE 1

1-1. Synthesis of 4-nadimidebenzoic acid 32.83 g (0.2 mol) of 5-norbornene-2,3-dicarboxylic anhydride and 400 Mℓ of glacial acetic acid were put into a 1000 Mℓ flask and then heated to a temperature of 110° C. to dissolve the 5-norbornene-2,3-dicarboxylic anhydride in the glacial acetic acid, and then an excess amount of 4-aminobenzoic acid (41.1 g (0.3 mol)) was added thereto to form a mixed solution. Subsequently, the mixed solution was stirred and allowed to react for 2 hours, and was then precipitated at room temperature to obtain a precipitate. Then, the precipitate was washed with glacial acetic acid and water, and was then dried in a vacuum oven at 60° C. to prepare 4-nadimidebenzoic acid. The yield thereof was 95%.

1-2. Synthesis of a Liquid Crystal Thermosetting Oligomer 10.789 g (0.065 mol) of isophthalic acid, 47.948 g (0.254 mol) of 6-hydroxy-2-naphthoic acid, 14.187 g (0.130 mol) of 4-aminophenol and 58.396 g (9.5 mol) of acetic anhydride were put into a 500 Mℓ flask provided with a condenser and a mechanical stirrer, were slowly heated to a temperature of 140° C. under a nitrogen atmosphere, and were than reacted for 3 hours to complete acetylation. Subsequently, the 4-nadimidebenzoic acid (36.79 g (0.130 mol)) prepared in Preparation Example 1-1 was added to the acetylated product, and then the acetylated product was heated to a temperature of 215° C. at a heating rate 1~2° C./min while removing acetic acid and unreacted acetic anhydride, which are side products, therefrom, and then reacted with the added 4-nadimidebenzoic acid at 215° C. for 4 hours to obtain a liquid crystal thermosetting oligomer represented by Formula 13 below, which is provided at one or more ends of the main chain thereof with nadimide groups.

[Formula 13]

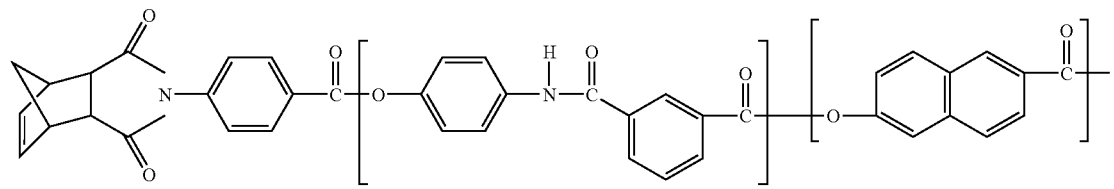

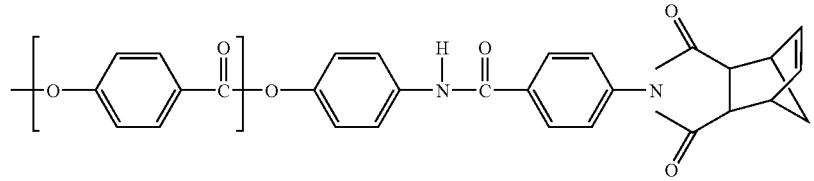

Figure 2:
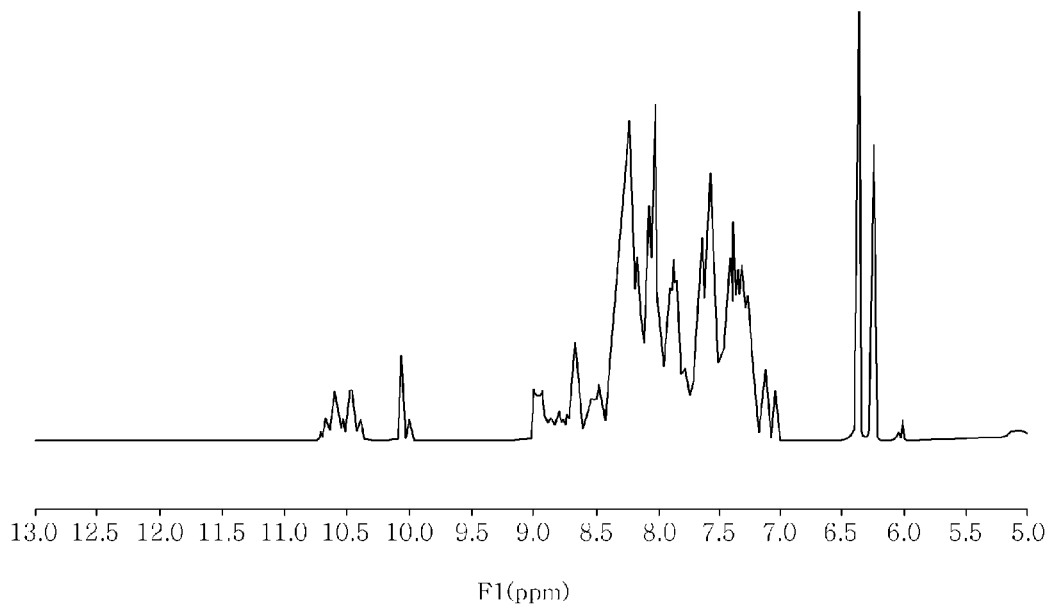
FIG. 2 is a graph showing the results of NMR analysis of a liquid crystal thermosetting oligomer synthesized in Preparation Example 1-2.

In order to examine whether reactive functional groups were provided at the ends of the liquid crystal thermosetting oligomer prepared in Preparation Example 1-2, nuclear magnetic resonance (Bruker NMR, DPX300) analysis was conducted. In this NMR analysis, dimethyl sulfoxide (DMSO) was used as a solvent. As shown in FIG. 2, since peaks attributable to nadimide appeared in a range of 6.2~6.4, it can be verified that nadimide groups were provided at the ends of the liquid crystal thermosetting oligomer.

Figure 3:
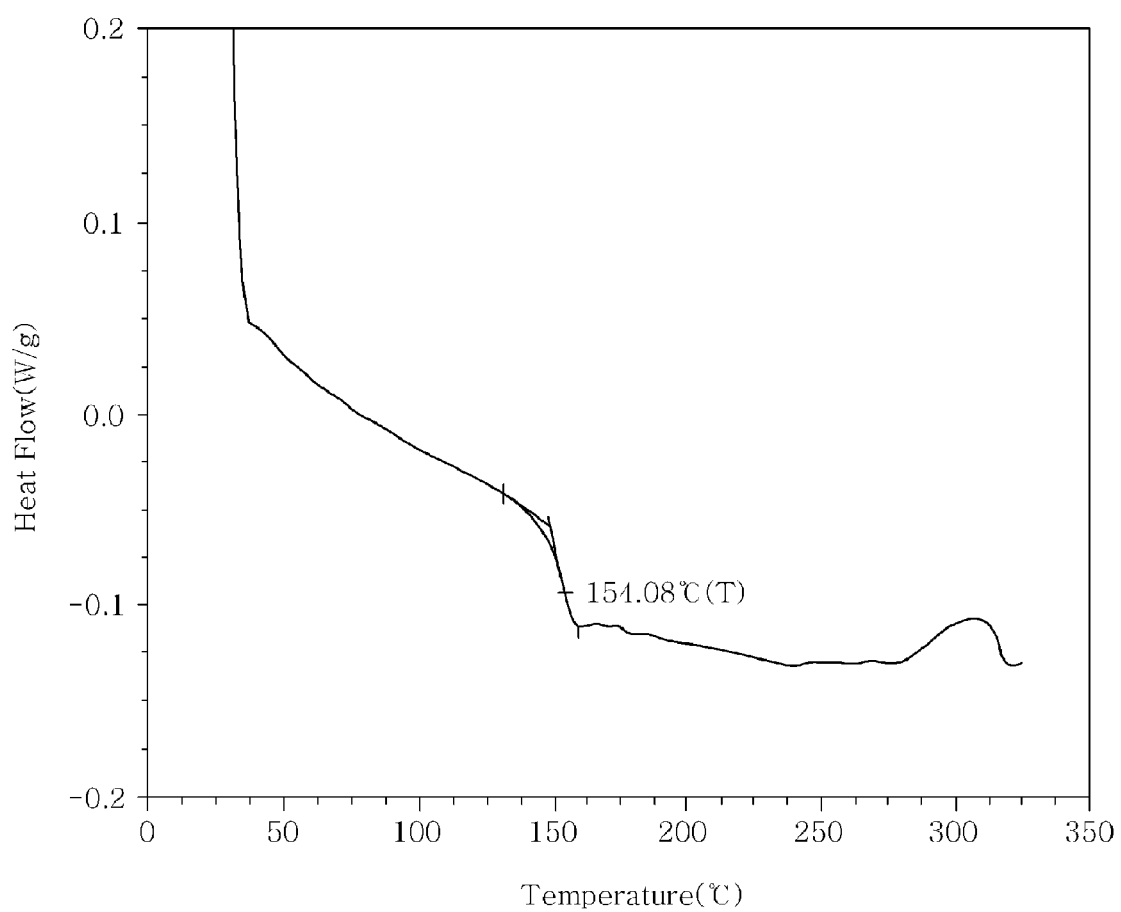
FIG. 3 is a graph showing the results of measuring the reaction temperature of a liquid crystal thermosetting oligomer synthesized in Preparation Example 1-2 using a differential scanning calorimeter (DSC).

The reaction temperature of the liquid crystal thermosetting oligomer prepared in Preparation Example 1-2 was measured using a differential scanning calorimeter (TA Instrument DSC 2010), and the results thereof are shown in FIG. 3. Here, heating rate was 20° C./min until the reaction temperature became 320° C. As shown in FIG. 3, since peaks attributable to the reactive functional groups appeared in a range of 280~320° C., it can be verified that the reactive functional groups were successfully provided at the ends of the liquid crystal thermosetting oligomer.

PREPARATION EXAMPLE 2

2-1. Synthesis of 4-maleimide-benzoyl Chloride 41.1 g (0.3 mol) of p-aminobenzoic acid and 300 Mℓ of acetic acid were put into a 250 Mℓ flask to dissolve the p-aminobenzoic acid in the acetic acid, and then 29.4 g (0.3 mol) of maleic anhydride was slowly added thereto at 10° C. to obtain a yellow precipitate. This precipitate was recrystallized with a solution of DMF (dimethylformamide) and ethanol (50:50, w/w) to form an intermediate. The intermediate was treated at 85° C. for 15 minutes using sodium acetate and acetic anhydride, was cooled to room temperature, and was then precipitated in an ice water bath to obtain a precipitate. The obtained precipitate was recrystallized with a solution of ethyl acetate and n-hexane (50:50, w/w) to obtain N-(p-carboxyphenyl)maleimide.

The obtained N-(p-carboxyphenyl)maleimide (15 g (0.07 mol)) was mixed with 80 Mℓ of benzene. Then, 21.83 g (0.172 mol) of oxalyl chloride was slowly added thereto, heated and then refluxed for 2 hours to obtain an intermediate. Subsequently, unreacted oxalyl chloride was removed from the intermediate, and the intermediate was cooled to room temperature, filtered and then washed with hexane to obtain 4-maleimide-benzoyl chloride.

2-2. Synthesis of a Liquid Crystal Thermosetting Oligomer

100 Mℓ of dimethylformamide was put into a 250 Mℓ flask, and then 3.274 g (0.03 mol) of 4-aminophenol, 4.655 g (0.025 mol) of 4,4-dihydroxybiphenyl and 18 Mℓ of triethylamine were added thereto, dissolved and then cooled with ice water, and then 10.151 g (0.05 mol) of isoprothalonil chloride was added thereto. The mixture was reacted at room temperature for 60 hours, washed with water and ethanol, and then dried to obtain an intermediate.

1 g of the intermediate was dissolved in 9 g of N-methylpyrrolidone (NMP), and then 0.1 g of the 4-maleimide-benzoyl chloride obtained in Preparation Example 2-1 and 10 Mℓ of triethylamine were added thereto and then reacted for 12 hours to obtain a liquid crystal thermosetting oligomer represented by Formula 14 below, which is provided at one or more ends thereof with maleimide groups.

[Formula 14]

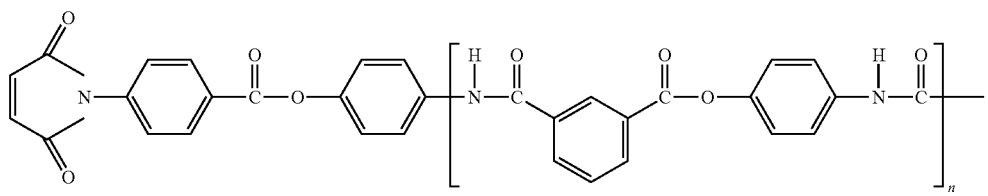

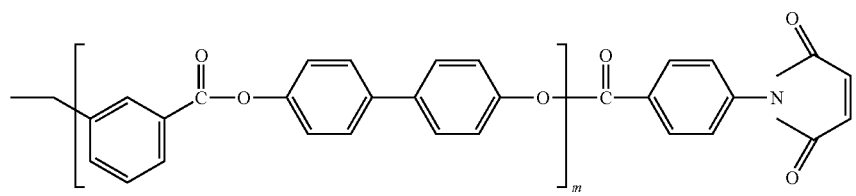

EXAMPLE 1

15 g of the liquid crystal thermosetting oligomer obtained in Preparation Example 1 and 25 g of N-methyl-2-pyrrolidone (NMP) were put into a 100 Mℓ flask provided with a condenser and a stirrer, and were then slowly heated to a temperature of 90° C. and simultaneously stirred to melt the liquid crystal thermosetting oligomer. Subsequently, 7 g of an acrylic silane compound and 5 g of traethylorthosilicate (TEOS) were added thereto and then stirred to form a composition. The composition was mixed with 4 g of water and 0.2 g of 60% nitric acid, and then reacted for 2 hours to obtain a reaction solution. The obtained reaction solution was film-cast on the surface of polyethyleneterephthalate (PET), and was then dried in an oven at 60° C. for 1 hour to obtain a film. Subsequently, PET was removed from the film, and the film was thermally cured in an oven at 250° C. for 3 hours.

EXAMPLE 2

A film was obtained using the same method as in Example 1, except that 0.4 g of 20% sodium hydroxide, which is a base catalyst, was used to obtain the reaction solution instead of 0.2 g of 60% nitric acid, which is an acid catalyst.

COMPARATIVE EXAMPLE 1

20 g of bisphenol A epoxy, 7.5 g of diaminodiphenyl-methane(DDM) and 20 g of 2-methoxy ethanol (2-ME) were put into a 100 Mℓ flask provided with a condenser and a stirrer, and were then slowly heated to a temperature of 90° C. and simultaneously stirred to melt and mix the bisphenol A epoxy and DDM. Subsequently, the molten mixture was cured for 2 hours at constant temperature to obtain a reaction solution having viscosity suitable for film casting. The obtained reaction solution was film-cast on the surface of polyethyleneterephthalate (PET), and was then dried in an oven at 60° C. for 1 hour to obtain a film. Subsequently, PET was removed from the film, and the film was completely cured in an oven at 190° C. for 2 hours.

COMPARATIVE EXAMPLE 2

15 g of bisphenol A epoxy, 8.5 g of aminosilane, 6 g of traethylorthosilicate (TEOS) and 15 g of 2-methoxy ethanol (2-ME) were put into a 100 Mℓ flask provided with a condenser and a stirrer. Subsequently, 4 g of water and 0.2 g of 60% nitric acid were added thereto, and were then slowly heated to a temperature of 90° C. and simultaneously stirred to form a mixture of bisphenol A epoxy and silane compounds. Subsequently, the mixture was reacted for 2 hours at constant temperature to obtain a reaction solution. The obtained reaction solution was film-cast on the surface of polyethyleneterephthalate (PET), and was then dried in an oven at 60° C. for 1 hour to obtain a film. Subsequently, PET was removed from the film, and the film was completely cured in an oven at 190° C. for 2 hours.

COMPARATIVE EXAMPLE 3

A film was obtained using the same method as in Comparative Example 2, except that 0.4 g of 20% sodium hydroxide, which is a base catalyst, was used to obtain the reaction solution instead of 0.2 g of 60% nitric acid, which is an acid catalyst.

EXPERIMENTAL EXAMPLE 1

The coefficients of thermal expansion (CTEs) and glass transition temperatures of the film obtained in Examples 1 to 2 and Comparative Examples 1 to 3 were respectively measured using TMA Q400, and the results thereof are given in Table 1 below. The measurement was conducted at a heating rate of 10° C./min in a state in which the films were purged with nitrogen. In Table 1, a low-temperature thermal expansion coefficient is an average value measured in a range of 50~100° C., and a high-temperature thermal expansion coefficient is an average value measured in a range of 170~220° C.

TABLE 1

| | Exp. 1 | Exp. 2 | Comp. Exp. 1 | Comp. Exp. 2 | Comp. Exp. 3 |
|---|---|---|---|---|---|
| Low-temperature thermal expansion coefficient (ppm/° C.) | 19.4 | 22.5 | 65.3 | 61.7 | 64.7 |
| High-temperature thermal expansion coefficient (ppm/° C.) | 28.4 | 26.9 | 163.9 | 119.9 | 113 |
| Glass transition temperature (° C.) | — | — | 138.5 | — | — |

As given in Table 1, the films (Comparative Examples 1 to 3) obtained through conventional technologies exhibit high high-temperature thermal expansion coefficient, whereas the films (Examples 1 to 2) obtained through the use of a liquid crystal thermosetting oligomer and a metal alkoxide compound according to the present invention exhibit much lower high-temperature thermal expansion coefficient than that of the conventional films. Further, since the films manufactured using the composition for forming a substrate according to the present invention do not have glass transition temperature, it is expected that they exhibit stable physical properties without rapidly changing mobility at specific points.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A composition for forming a substrate, comprising:
   a liquid crystal thermosetting oligomer having one or more soluble structural units in a main chain thereof and having thermosetting groups at one or more ends of the main chain thereof; and
   a metal alkoxide compound having reaction groups which is covalently bondable with the thermosetting groups.

2. The composition for forming a substrate according to claim 1, wherein the soluble structural unit includes an arylamine group of C4~C30 or an aryl-amide group of C4~C30.

3. The composition for forming a substrate according to claim 1, wherein the soluble structural unit includes a compound represented by Formula 1 below:

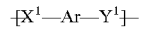

Formula 1 wherein Ar is an aryl group of C4~C30; and $X^1$ and $Y^1$ are each independently selected from the group consisting of COO, O, CONR", NR"40 and CO, in which R" and R"40 are each independently selected from the group consisting of a hydrogen atom, an alkyl group of C1~C20 and an aryl group of C6~C30, and at least one of $X^1$ and $Y^1$ is CONR'' or NR'''.

4. The composition for forming a substrate according to claim 3, wherein the soluble structural unit includes one or more structural units selected from among compounds represented by Formula 2 below:

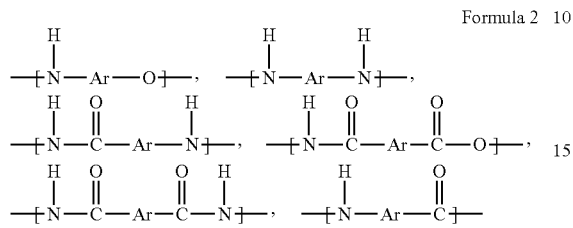

Formula 2 wherein Ar is an aryl group of C4~C30.

5. The composition for forming a substrate according to claim 4, wherein the Ar is an aryl group or a substitution product thereof selected from among compounds represented by Formula 3 below:

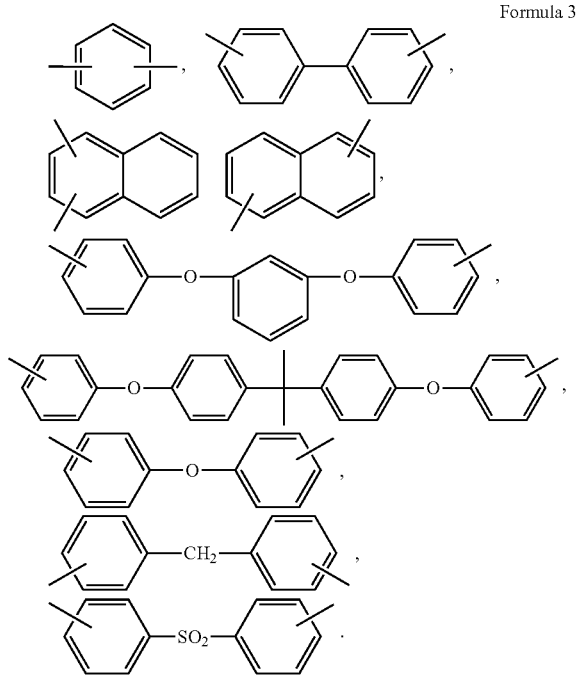

Formula 3

6. The composition for forming a substrate according to claim 1, wherein the soluble structural unit is included in an amount of more than 5 mol% to 60 mol% or less based on a total amount of all structural units.

7. The composition for forming a substrate according to claim 1, wherein the liquid crystal thermosetting oligomer further includes a structural unit represented by Formula 4 in its main chain:

$-[X^2-Ar-Y^2]-$   Formula 4 wherein Ar is an aryl group of C4~C30; and $X^2$ and $Y^2$ are each independently selected from the group consisting of COO, O, CONR'', NR'''and CO, in which R'' and R'''are each independently selected from the group consisting of a hydrogen atom, an alkyl group of C1~C20 and an aryl group of C6~C30.

8. The composition for forming a substrate according to claim 7, wherein the structural unit represented by Formula 4 above includes one or more structural units selected from among compounds represented by Formula 5 below:

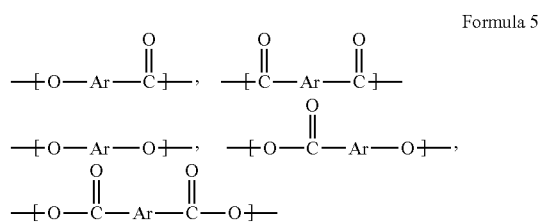

Formula 5 wherein Ar is an aryl group of C4~C30.

9. The composition for forming a substrate according to claim 8, wherein the Ar is selected from among compounds represented by Formula 3 below:

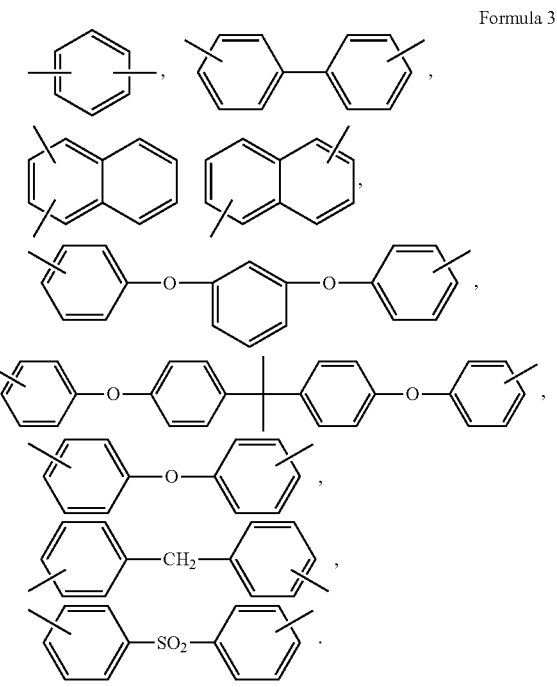

Formula 3

10. The composition for forming a substrate according to claim 1, wherein the thermosetting group is a thermal crosslinking reaction group.

11. The composition for forming a substrate according to claim 1, wherein the thermosetting group is selected from the group consisting of maleimide, nadimide, phthalimide, acetylene, propagyl ether, benzocyclobutene, cyanate, and substitution products or derivatives thereof.

12. The composition for forming a substrate according to claim 1, wherein the liquid crystal thermosetting oligomer is a compound represented by Formula 6 below:

$Z^1-(R^1)_m-(R^2)_n-Z^2$   Formula 6 wherein $R^1$ is one or more structural units selected from among compounds represented by Formula 2 below; $R^2$ is one or more structural units selected from among compounds represented by Formula 5 below; $Z^1$ and $Z^2$ are identical to or different from each other, and are each independently selected from the group consisting of hydrogen, halogen, a hydroxy group, maleimide, nadimide, phthalimide, acetylene, propagyl ether, benzocyclobutene, cyanate, and substitution products or derivatives thereof; at least one of $Z^1$ and $Z^2$ is selected from the group consisting of maleimide, nadimide, phthalimide, acetylene, propagyl ether, benzocyclobutene, cyanate, and substitution products or derivatives thereof; n and m are each independently an integer of 1~50; and n/(n+m+2) is more than 5% to 60% or less:

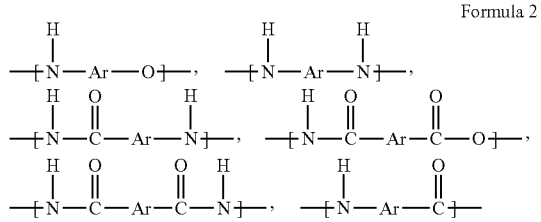

Formula 2 wherein Ar is an aryl group of C4~C30;

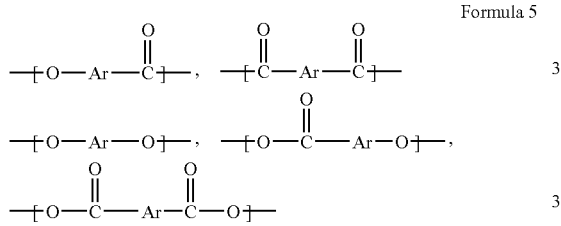

Formula 5 wherein Ar is an aryl group of C4~C30.

13. The composition for forming a substrate according to claim 1, wherein the liquid crystal thermosetting oligomer is a compound represented by Formula 7 or Formula 8 below:

14. The composition for forming a substrate according to claim 1, wherein the liquid crystal thermosetting oligomer has a number average molecular weight of 500~15,000.

15. The composition for forming a substrate according to claim 1, wherein the reaction group, which is covalently bondable with the thermosetting group, is selected from the group consisting of a vinyl group, an acryl group, a methacryl group, a mercapto group, and combinations thereof.

16. The composition for forming a substrate according to claim 1, wherein the metal alkoxide compound includes a metal selected from the group consisting of Ti, Al, Ge, Co, Ca, Hf, Fe, Ni, Nb, Mo, La, Re, Sc, Si, Ta, W, Y, Zr and V.

17. The composition for forming a substrate according to claim 1, wherein the composition includes 5~200 parts by weight of the metal alkoxide compound based on 100 parts by weight of the liquid crystal thermosetting oligomer.

18. The composition for forming a substrate according to claim 1, further comprising an inorganic filler.

19. A prepreg prepared using the composition of claim 1.

20. A substrate manufactured using the composition of claim 1.

21. A composition for forming a substrate, comprising:
a liquid crystal thermosetting oligomer having one or more soluble structural units in a main chain thereof and having thermosetting groups at one or more ends of the main chain thereof; and
a metal alkoxide compound having reaction groups which is covalently bondable with the thermosetting groups;
wherein the liquid crystal thermosetting oligomer is a compound represented by Formula 6 below:

$$Z^1—(R^1)_m—(R^2)_n—Z^2 \quad\quad \text{Formula 6}$$

wherein $R^1$ is one or more structural units selected from among compounds represented by Formula 2 below; $R^2$ is one or more structural units selected from among compounds represented by Formula 5 below; $Z^1$ and $Z^2$ are identical to or different from each other, and are each independently selected from the group consisting of hydrogen, halogen, a hydroxyl group, maleimide,

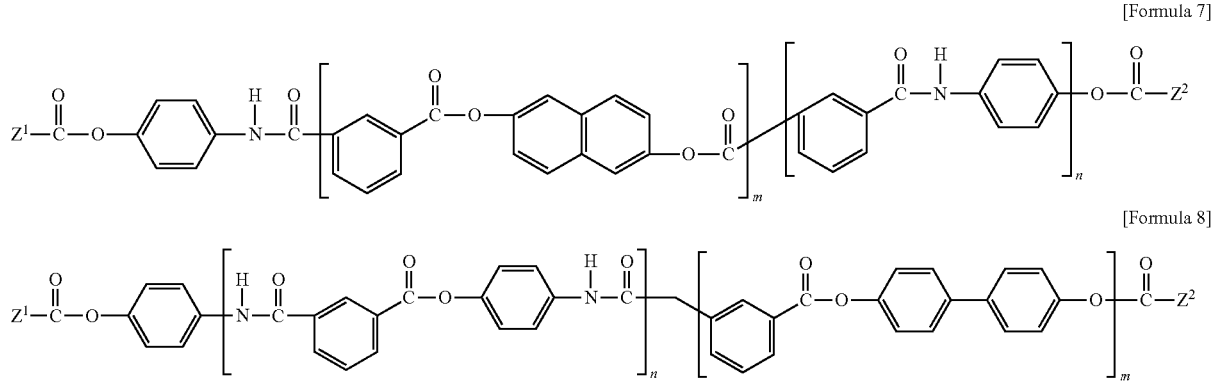

[Formula 7]

[Formula 8]

wherein $Z^1$ and $Z^2$ are identical to or different from each other, and are each independently selected from the group consisting of maleimide, nadimide, phthalimide, acetylene, propagyl ether, benzocyclobutene, cyanate, and substitution products or derivatives thereof; and n and m are each independently an integer of 1~50.

nadimide, phthalimide, acetylene, propagyl ether, benzocyclobutene, cyanate, and substitution products or derivatives thereof; at least one of $Z^1$ and $Z^2$ is selected from the group consisting of maleimide, nadimide, phthalimide, acetylene, propagyl ether, benzocyclobutene, cyanate, and substitution products or derivatives thereof; n and m are each independently an integer of 1~50; and n/(n+m+2) is more than 5% to 60% or less:

Formula 2
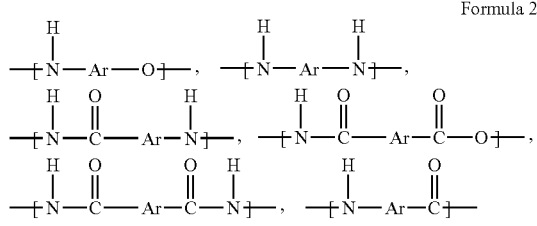
wherein Ar is an aryl group of C4~C30;
Formula 5
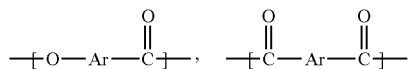
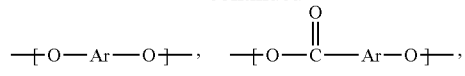
wherein Ar is an aryl group of C4~C30; and wherein the metal alkoxide compound includes a metal selected from the group consisting of Ti, Al, Ge, Co, Ca, Hf, Fe, Ni, Nb, Mo, La, Re, Sc, Si, Ta W, Y, Zr and V.
* * * * *